United States Patent [19]
Wojcicki et al.

[11] Patent Number: 5,402,388
[45] Date of Patent: Mar. 28, 1995

[54] VARIABLE LATENCY SCHEME FOR SYNCHRONOUS MEMORY

[75] Inventors: Tomasz Wojcicki, Kanata; Graham Allan, Stittsville; Francis Larochelle, Hull, all of Canada

[73] Assignee: Mosaid Technologies Incorporated, Kanata, Canada

[21] Appl. No.: 167,489

[22] Filed: Dec. 16, 1993

[51] Int. Cl.⁶ .............................................. G11C 7/00
[52] U.S. Cl. .............................. 365/233; 365/189.05; 365/193; 365/194
[58] Field of Search ............ 365/233, 194, 193, 189.05

[56] References Cited
U.S. PATENT DOCUMENTS

5,206,832  4/1993  Yamaguchi et al. ............ 365/193 X
5,208,779  5/1993  Walther et al. ................. 365/233 X

*Primary Examiner*—Do Hyun Yoo
*Attorney, Agent, or Firm*—Pascal & Associates

[57] ABSTRACT

The present invention relates to a method of writing or reading a semiconductor random access memory (DRAM or SRAM) having plural sense amplifiers connected to bit lines and having data bus read and write amplifiers, formed of providing a pair of data buses for access by each sense amplifier and each read and write amplifier, reading or writing one data bus while precharging the other data bus during a first read or write cycle, and reading or writing the other data bus while precharging the first data bus in a second read or write cycle following the first read or write cycle.

6 Claims, 8 Drawing Sheets

VARIABLE LATENCY SCHEME FOR SYNCHRONOUS MEMORY

FIELD OF THE INVENTION

This invention relates to semiconductor memory circuits, and in particular to a latency control circuit for a random access memory circuit such as a synchronous dynamic random access memory (SDRAM) circuit.

BACKGROUND TO THE INVENTION

A description of SDRAMs may be found in the article "Synchronous DRAMs: Designing to the JEDEC Standard", in MICRON Design Line, volume 2, Issue 2, No 2Q93.

Synchronous DRAMs can utilize different CAS latency modes of operation. For example, for a CAS latency of 1, data which is read by its data bus read amplifier arrives at its output buffer after the clock. For a CAS latency of 3, the data waits for the clock at a stage preceding the output buffer. For a latency of 2 there is a race condition between the data and the clock to the output buffer.

SUMMARY OF THE INVENTION

The present invention is a variable latency circuit that reads the data logic level on the SDRAM databus leads, and presents it to the output buffer in a manner in which the latency is automatically adjusted, and the data can be always output from the output buffer in synchronization with the clock, and always following the leading edge of a clock cycle, with the proper delay so that it follows the leading edge of a first clock pulse for a latency of one, it follows the leading edge of a second clock pulse for a latency of two, and follows the leading edge of a third clock pulse for a latency of three.

In accordance with an embodiment of the invention, a variable latency output circuit for a synchronous dynamic random access memory (SDRAM) is comprised of a circuit for reading complementary data bus lines, a circuit for receiving an output signal of the reading circuit, an output buffer for receiving an output signal of the receiving circuit, and for providing an output signal to an output driver latency counter for receiving and counting a clock signal and for providing an output enable signal upon counting a predetermined number of clock pulses based on a predetermined latency, and a circuit for enabling the reading circuit, the receiving circuit and the output buffer to pass data logic levels from the data bus lines to the output driver within one clock cycle in the event of a latency of one, for delaying the data logic levels for one clock cycle in the event of a latency of two, and for delaying the data logic levels for two clock cycles in the event of a latency of three.

BRIEF INTRODUCTION TO THE DRAWINGS

A better understanding of the invention will be obtained by a consideration of the detailed description below of a preferred embodiment, with reference to the following drawings, in which.

DESCRIPTION OF A PREFERRED EMBODIMENT OF THE INVENTION

Figure 1:
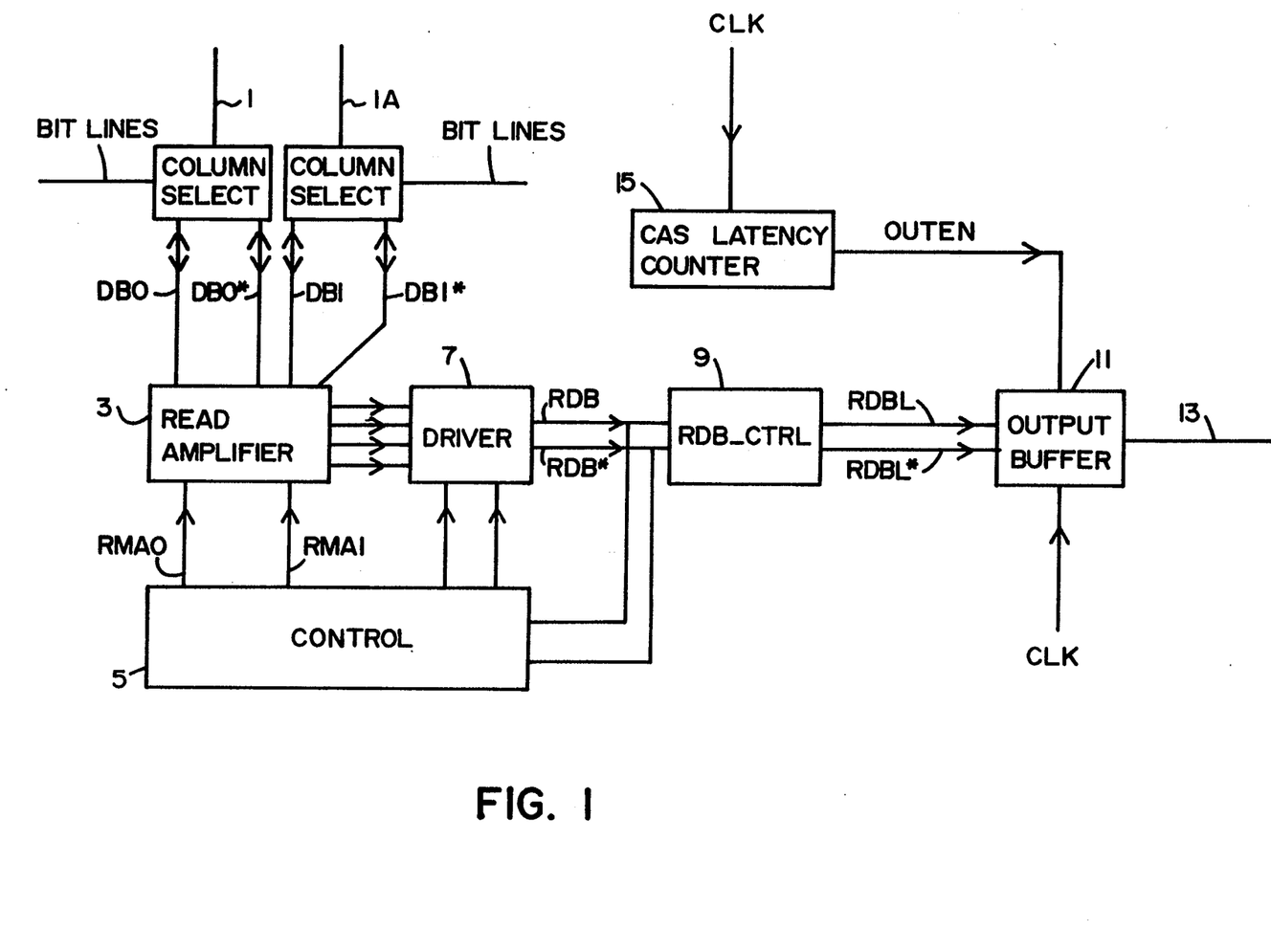
FIG. 1 is a block diagram of the invention.

Turning now to FIG. 1, a block diagram of an embodiment of the invention is shown. A pair of column select circuits 1 and 1A of well known construction apply data logic levels each to a pair of databuses DB0 and DB0* and DB1 and DB1* respectively after having columns decoded, the data logic levels having been sensed in sense amplifiers from bit storage cells associated with the bit lines. The data buses are read in read amplifiers upon receiving respective enable signals RMA0 and RMA1 from a control circuit 5. In accordance with an embodiment of this invention, the read amplifiers are formed as two portions, an amplifier stage 3 and a driver stage 7.

The RDB and RDB* outputs of the driver stage 7 are applied to a read databus control circuit 9 (RDB_CTRL), which provides outputs RDBL and RDBL* to an output buffer 11. Output buffer 11 outputs a driver output signal on output lead 13.

A clock source CLK is received by a CAS latency counter 15, which has an output OUTEN that is input to output buffer 11.

As noted earlier, synchronous DRAMs can utilize different CAS latency modes of operation. For example, for a CAS latency of 1, data which is read by the data bus read amplifier arrives at the output buffer after the clock. For a CAS latency of 3, the data is available before the clock. For a latency of 2 there is a race condition between the data and the clock to the output buffer.

The latency counter counts clock pulses, and outputs a signal that goes to high logic level after a predetermined number of clock cycles. With a latency of one, the OUTEN signal goes to high logic level during the initial pulse of a clock cycle wherein the data to be output is read during the same clock cycle. With a latency of two or three, the OUTEN signal goes high during a clock cycle which precedes the data that is to be output by one clock cycle. Once counter 15 has counted to the latency value, it outputs a consistently high level signal OUTEN.

To handle a latency of one, the data read by read amplifier is output through driver 7, RDB_CTRL circuit 9 and the output buffer 11 without delay, but synchronized with the clock signal CLK, and with the OUTEN signal high, is output to lead 13 in synchronization with the clock.

To handle a latency of two and eliminate the race condition, the data is passed from read amplifier 3 and driver 7 to RDB_CTRL circuit 9, where it is stored for one clock cycle, in order to delay it to a time later than the leading edge of the second clock cycle. With the OUTEN signal high, upon receiving the next clock cycle on the CLK lead, the output buffer outputs the data signal on the lead 13 in synchronism with the clock.

To handle a latency of three, the data is stored in a latch in read amplifier 3 for one clock pulse, then passes the data to the latch in the RDB_CTRL circuit where it is stored for one clock pulse, and upon receiving the next clock cycle, outputs the data on the lead 13 in synchronism with the clock.

Since for latency three (or in some cases of latency two) the data is received prior to the beginning of a clock cycle, the effect of the above is to output the data in synchronism with and during the third (second) clock cycle. While for a latency of one the data is output in synchronism with and during the first clock cycle.

Figure 2:
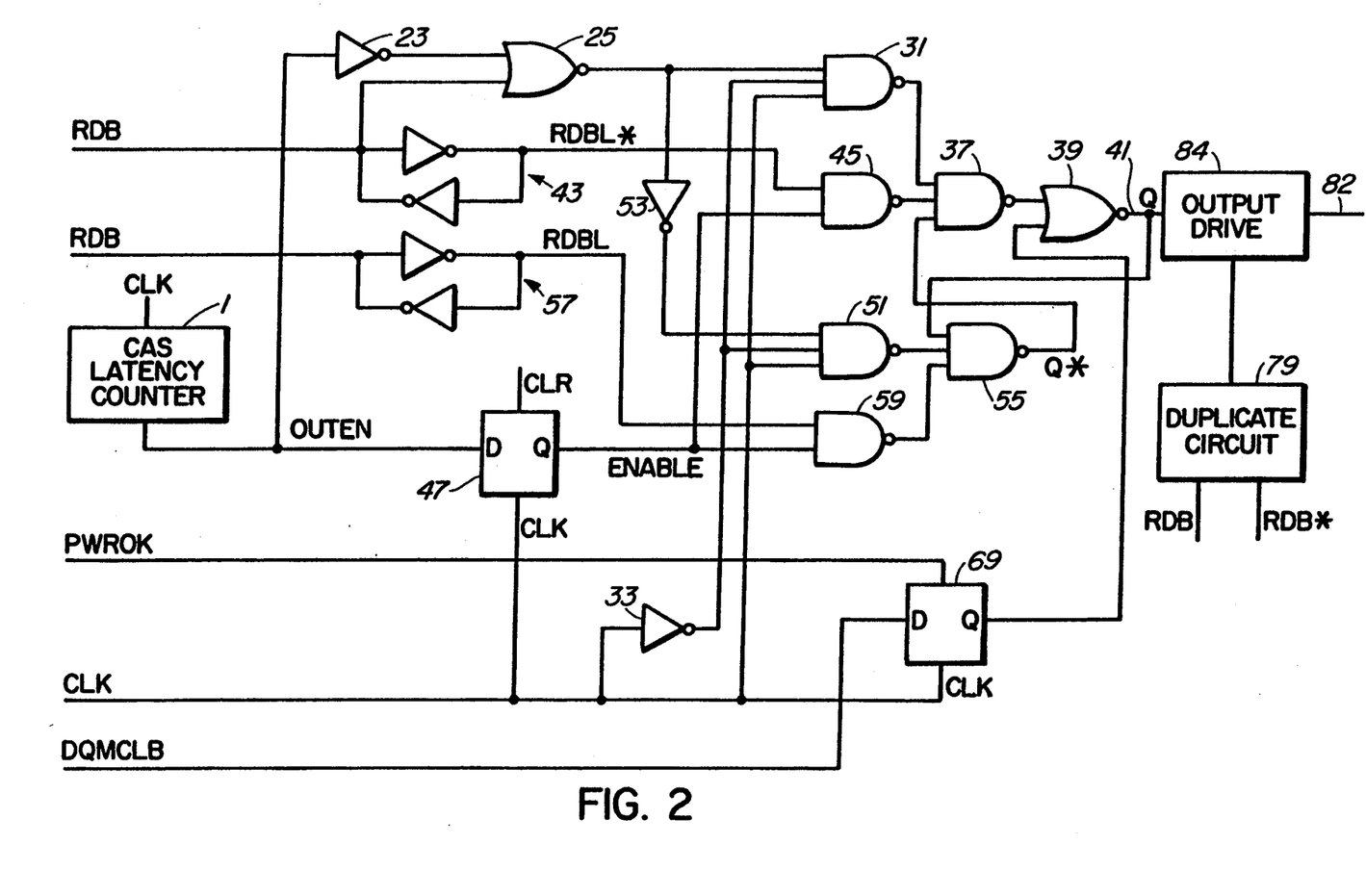
FIG. 2 is a schematic diagram of a databus control and output buffer portion of the invention.
Figure 3:
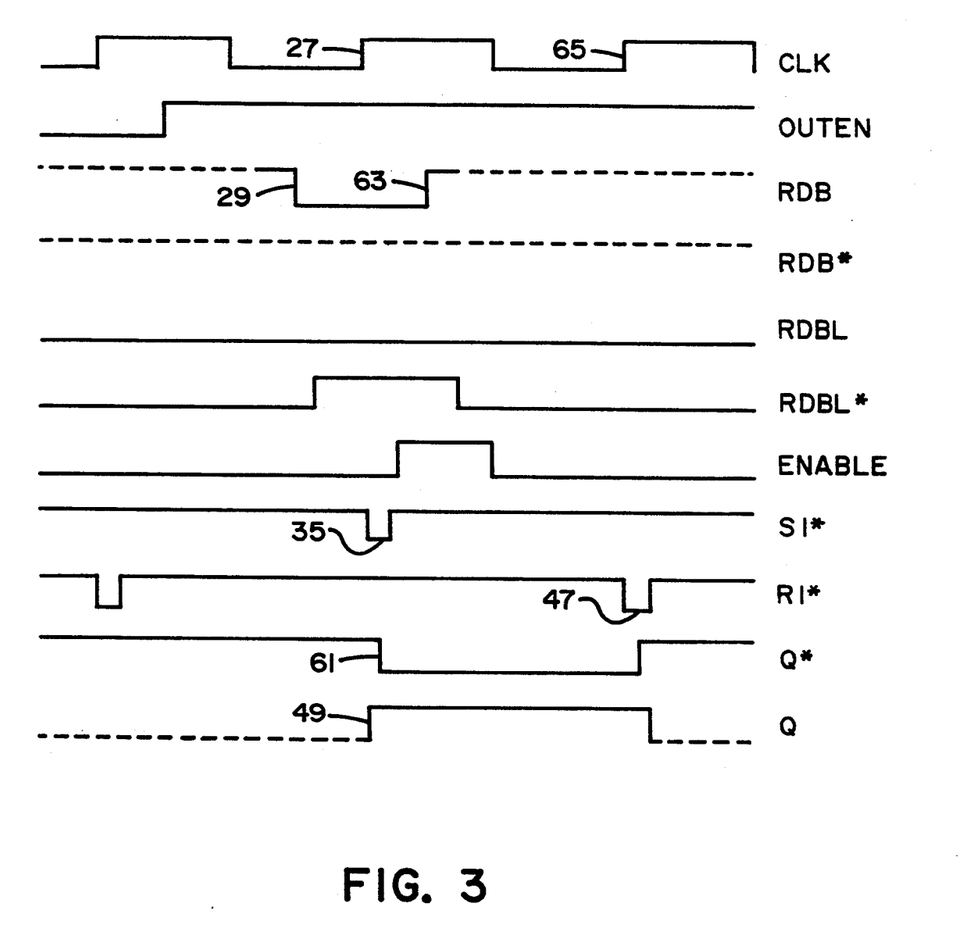
FIGS. 3 and 4 are timing diagrams of the circuit of FIG. 2.

Reference is now made to FIG. 2, which is a logic diagram of the RDB_CTRL circuit 9 and of the output buffer 11, as well as to the timing diagram illustrated in FIG. 3, which is a timing diagram of signals for the case in which the data is received prior to the clock. The first signal shown is the CLK signal, which has regular clock pulses. At a particular time, the CAS latency circuit has counted to a predetermined latency value, and a high logic level output signal OUTEN is provided as noted earlier. That signal is inverted in inverter 23 and is applied to an input of NOR gate 25.

As may be seen from FIG. 3, at a time prior to the rising edge 27 of a clock pulse, the leading edge 29 of a negative logic level data pulse RDB appears, which is applied to the other input of NOR gate 25. With the OUTEN signal at high logic level which causes the input to gate 25 to be at low logic level from inverter 23 and RDB at low logic level, the gate 25 changes its output to a high logic level, and applies this logic level to an input of NAND gate 31.

When the CLK signal goes to high logic level at the time of leading edge 27, another input to NAND gate 31 goes to high logic level from the CLK input. The CLK signal is also applied to inverter 33. Prior to its application to that inverter, its output is at high logic level. Thus at that point all three inputs to NAND gate 31 are at high logic level, and its output thus drops to low logic level. When the CLK signal is applied to inverter 33, it takes a short period of time to pass the signal, and then its output goes to low logic level, which is received by one of the inputs of NAND gate 31. The result, at the output S1 of NAND gate 31, is a short low logic level pulse 35, shown in timing diagram S1*.

The pulse output of NAND gate 31 is applied through AND gate 37 (and NOR gate 39 if it is used), to output terminal 41 (timing diagram Q), from where it is applied to an output driver at output Q.

The low logic level data signal RDB is caused to pass through gate 37 as follows. The data signal passes through cross-coupled inverters 43, where it is latched. it is also applied to an input of NAND gate 45. The high logic level OUTEN signal is applied to flip flop 47, which is clocked with the CLK signal, the Q output of which (see the ENABLE timing diagram) is applied to the other input of NAND gate 45.

The negative level of the RDB is also applied to NAND gate 51 (inverted in NOR gate 25 and inverter 53). This causes output R1, of gate 51 to remain at high logic level, which is input to NAND gate 55. With the other data line RDB* stable at high logic level, applied to cross-coupled inverters 57, where the data is latched. It is also applied to an input of NAND gate 59 with the ENABLE signal, and NAND gate 55 receives the high logic level R2* at its input. Another input of NAND gate 55 receives the output signal at Q. NAND gate 55 is cross coupled with AND gate 37, and the output at Q causes the output Q* of NAND gate 55 to go to low logic level, with leading edge 61.

The data pulse RDB eventually goes high, at trailing edge 63. This causes the signal on the RDBL* lead to go to low logic level. The result is that at the next rising leading edge 65 of the CLK signal, there is a low level temporary pulse 47 created at the output of the gate 51, which interrupts the latching effect of gates 37 and 55, which causes the Q* signal to go to high logic level, and once unlatched, the signal at Q to go to low logic level.

It should be noted that an external control can be provided for use by a user to control the operation of the output tri-state buffer by disabling the Q terminal. This can be provided by the use of NOR gate 39, which can be deleted if this user control is not desired. The second input of gate 39 has an input from flip flop 69, which is synchronized by clock signal CLK, and has a data input from user input DQMCLB.

Figure 4:
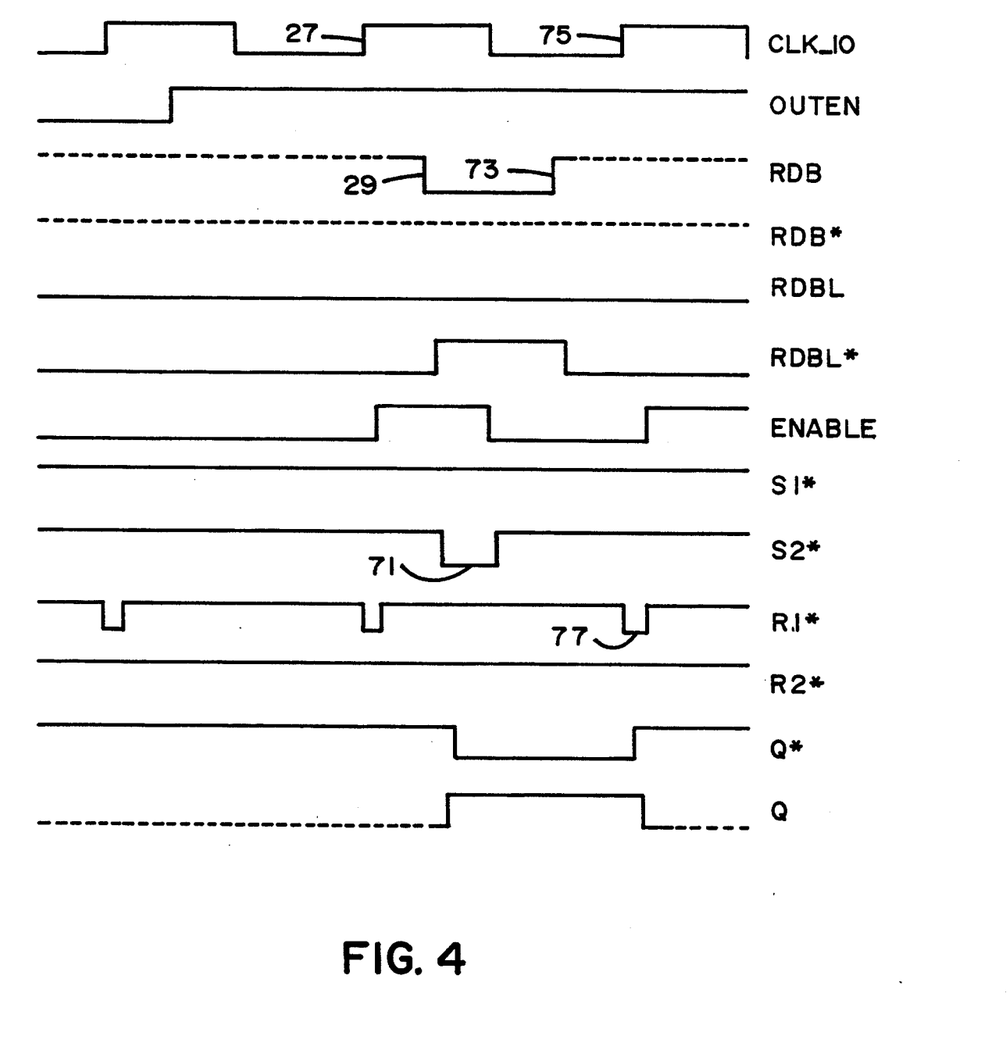

Turning now to FIG. 4, a timing diagram is shown in the case of data leading edge 29 on the RDB lead arriving after the leading edge 27 of the clock pulse, e.g. latency 1. With the RDB data going low coincident with the CLK signal being at high logic level, the RDBL, level goes to high level. Now with the ENABLE signal being high due to the latency counter having counted to a proper value the inputs of gate 45 are high, gate 45 outputs the low logic signal 71 shown in FIG. 3. This passes through gate 37 (and gate 39, if used), and appears on output Q, as output signal Q shown in FIG. 4.

The signal is enabled to pass through gate 37 because all of its inputs are at high logic level during this interval. The CLK inputs to gate 31 are high, the OUTEN signal is high and is inverted in inverter 23 during this interval and with the RDB signal being low and applied to gate 25, the output of gate 25 is low causes gate 31 to output a high logic level signal. The output signal of gate 25 being at inverted in inverter 53 causes the output of gate 51, which also receives signals CLK and inverted CLK pulses with each rising clock edge, creates pulses each rising clock edge, and is at high logic level during the inter-pulse interval, and with the output signal from gate 25 being inverted in inverter 53 being applied, the output of gate 51 is at high logic level. The ENABLE signal being at high level as described above is applied to gate 59 with the low level RDBL signal, causing gate 55 to be enabled and go to low logic level as shown by waveform Q*, with the output signal Q at lead 41 having gone to high logic level. Gates 37 and 39 thus latch.

The data signal RDB then goes to high level at the trailing edge 73. The RDBL, signal thus goes to low level. The circuit then waits for the next leading edge 75 of the CLK_IO signal, and when the pulse 77 resulting therefrom arrives, gate 51 displays this pulse at its output R1*,, causing gate 55 to release the latch, and first the signal Q*, at the output of gate 55 goes to high level, and then as a result, the signal Q goes to low level.

Thus it has been seen how the drive terminal Q has been driven to high level and low level by both the conditions of the data from the databus read amplifier arriving before the clock, and with the data arriving after the clock. It will also be seen that the signal at the drive terminal has been synchronized with the clock. In the case of a race condition (latency 2), one or the other of the conditions noted above will occur, but the output drive terminal will still be driven high and low, and synchronized with the clock, no matter which condition occurs.

More importantly for this invention, it will be seen that for a latency of 3, the data which had arrived prior to a clock pulse has been delayed by one clock cycle before being output, while for a latency of 1, the data which had arrived after a clock pulse is output within the same clock cycle during which it had arrived.

Figure 5:
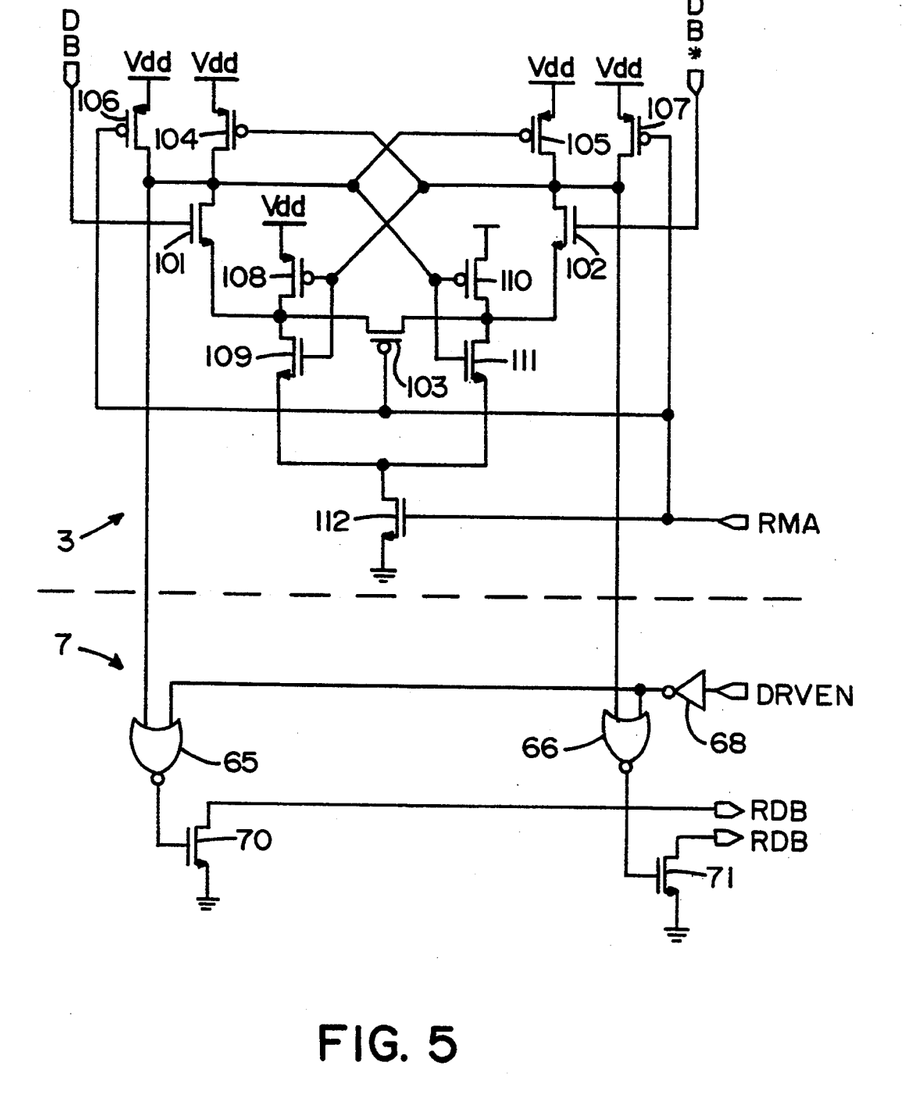
FIG. 5 is a schematic diagram of the read amplifier and driver stage portion of the invention.

FIG. 5 is a schematic diagram of the read amplifier 3 and of the driver stage 7 which is connected to the output of amplifier 3. The data bus leads DB (representing either DB0 or DB1) and DB* (representing either DB0* or DB1*) are connected to respective gates of n channel field effect transistors (FETs) 101 and 102. These transistors have their sources connected to the sources and drains respectively of p channel FET 103, 104, 105, 106, 107. The gate of FET 103 is connected to an RMA (representing either RMA0 or RMA1) lead, which receives a read command from control 5 (FIG. 1). The drains of FETs 101 and 102 are connected to the sources of p channel FETs 104 and 105 respectively, which have their sources connected to a voltage source Vdd. The gates of FETs 104 and 105 are crosscoupled to the drains of transistors 101 and 102. P channel FETs 106 and 107 have their source and drain circuits connected in parallel with the source and drain circuits of FETs 104 and 105, and have their gates connected to the RMA lead.

An inverter comprised of p channel FET 108 having its source-drain circuit connected in series with the drain and source circuit of n channel FET 109 have their gates connected to the gate of FET 104, the source of FET 108 being connected to a source of voltage Vdd. Another inverter comprised of p channel FET 110 having its source-drain circuit connected in series with the drain and source circuit of n channel FET 111 have their gates connected to the gate of FET 105, the source of FET 110 being connected to the source of voltage Vdd. The sources of FETs 109 and 111 are connected together to the drain of an n channel FET 112, which has its source connected to ground, and its gate connected to the RMA lead.

Output leads of the above-described read amplifier 3 are connected from the drains of FETs 106 and 107 respectively to an input of respective NOR gates 65 and 66. Other inputs of NOR gates 65 and 66 are connected to the output of inverter 68, which has as its input a DRVEN lead from the control 5. The outputs of the NOR gates are connected to gates of n channel output FETs 70 and 71, which have their sources connected to ground. The drains of FETs 70 and 71 are connected to the RDB and RDB* leads respectively, which are the input leads to the RDB_CTRL circuit described earlier.

Figure 6:
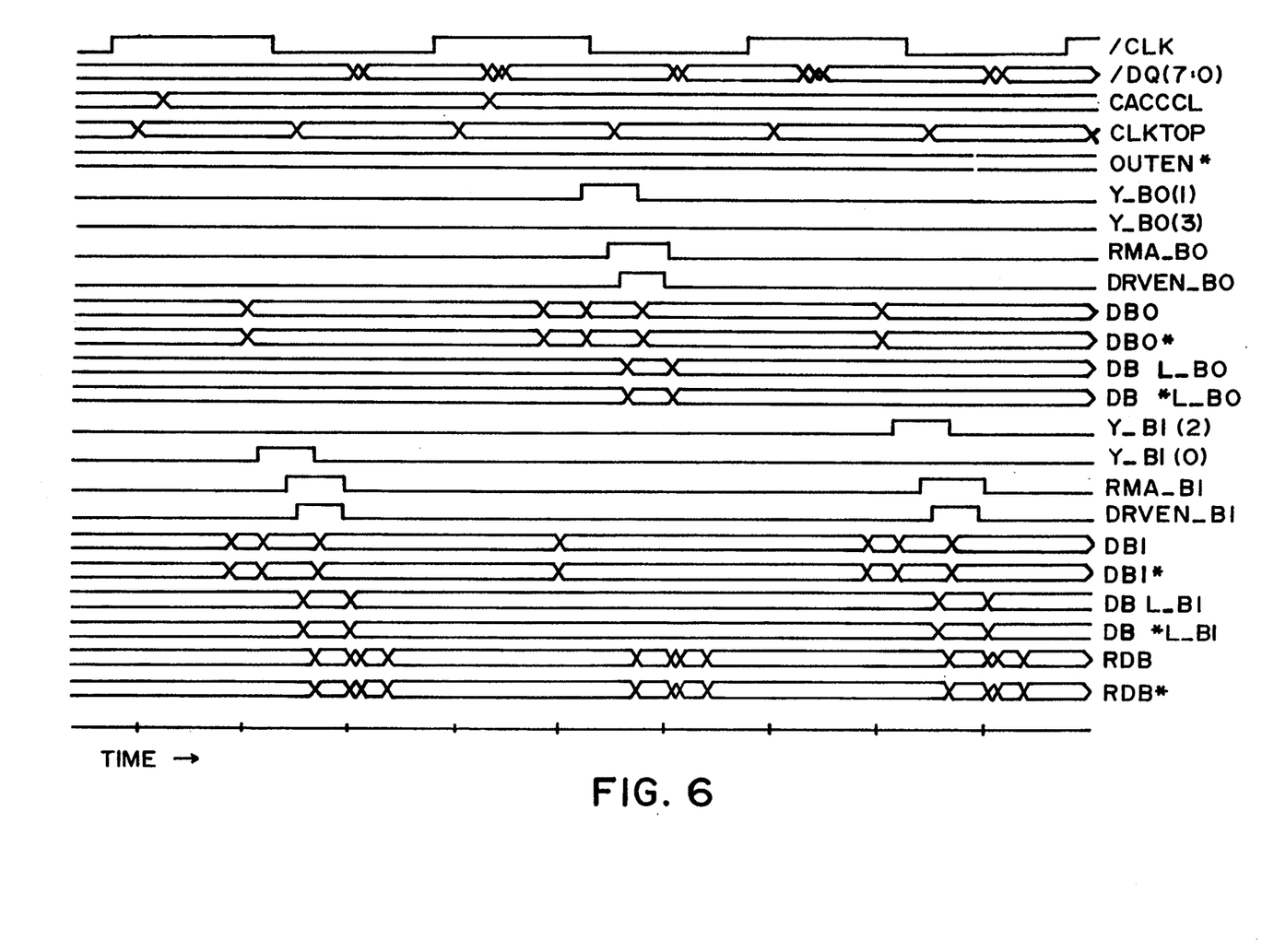
FIGS. 6, 7 and 8 are timing diagrams of circuit of FIG. 5.

Reference is now made to FIG. 6, which is a timing diagram for the latency 1 case for an example of operation. While there is no clock input to the amplifier 3 or driver 7 circuits, the CLK timing is shown, with the first part of each successive cycle numbered in a circle, in order to obtain recognition of the data timing.

Data appears on the DB and DB* leads (timing waveforms DB1 and DB1*), wherein it may be seen that the data goes to high level after the beginning of clock cycle 1. Under control of the control 5, a high logic level read enable pulse is applied to the RMA lead (timing diagram RMA_B1), which causes FET 112 to conduct, and thus to connect the sources of transistors 102 and 111 to ground. The transistor pairs 108, 109 and 110, 111 sense the level connected to their drains, which level is established by the differential logic levels on the DB and DB* leads. Either of transistor pairs 101, 104 or 102, 105 thus conduct, causing the voltage Vdd to be extended to the gates of corresponding transistor pairs 108, 109 or 110, 111. With the RMA voltage applied to the gate of FETs 106 and 107, the transistors do not conduct, causing the Vss voltage to be extended to only one input of corresponding NOR gate 65 or 66.

In the meantime, the crosscoupled transistors latch, retaining the data signal therein.

Figure 7:
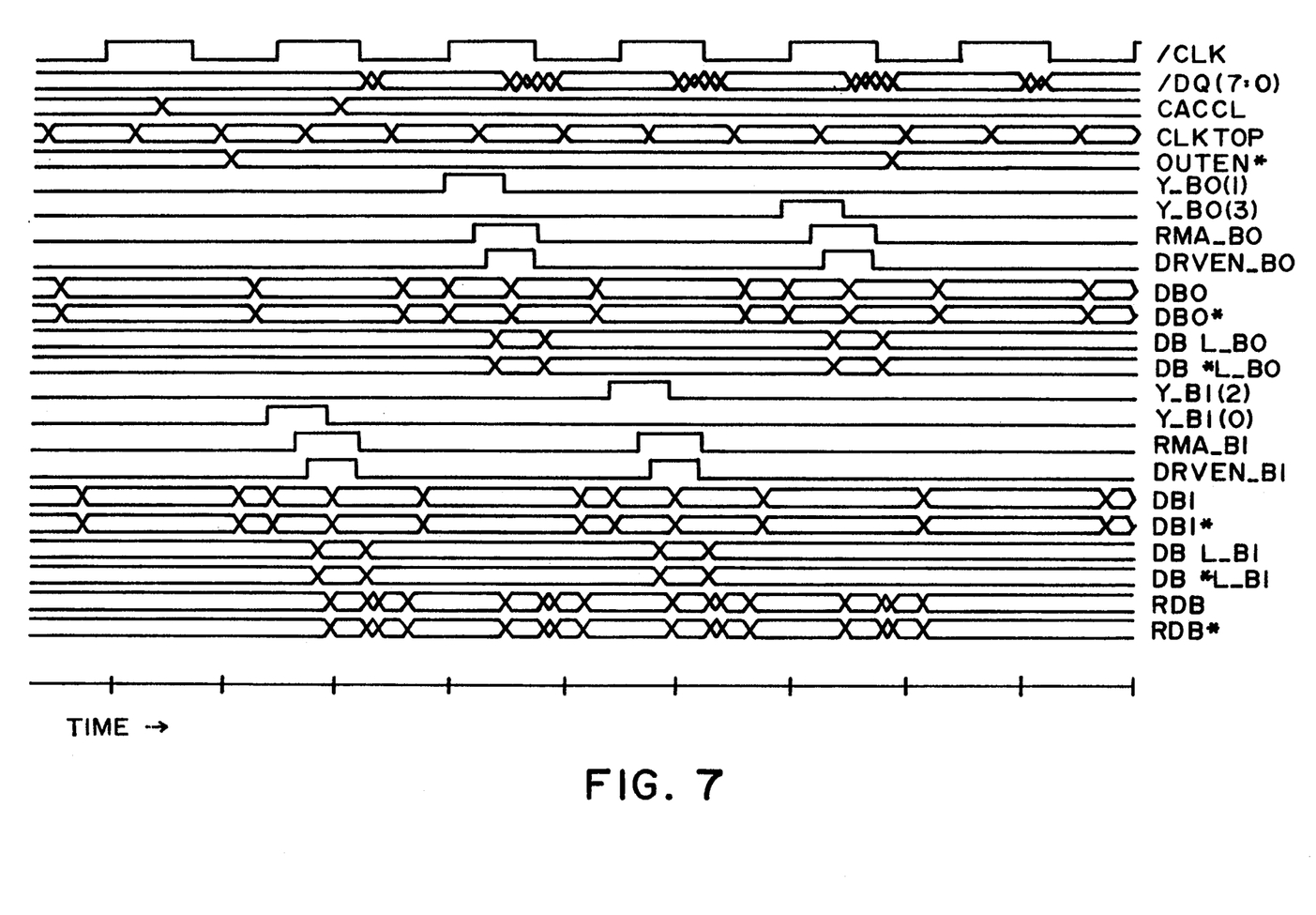
Figure 8:
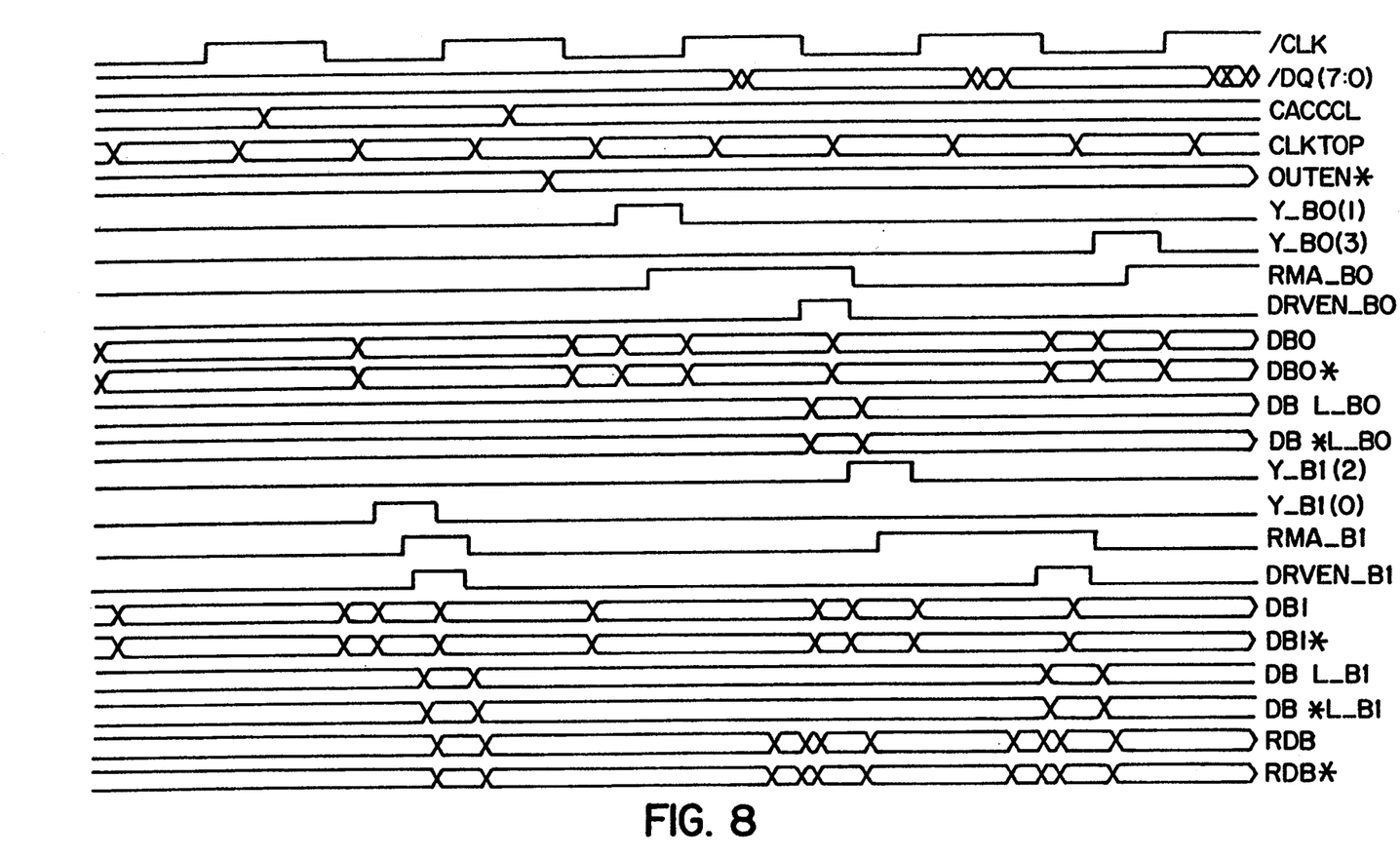

The timing of the various signals in the amplifier and driver stages for latency of 1 may be seen in FIG. 6, the timing for latency of 2 may be seen in FIG. 7, and the timing for latency of 3 may be seen in FIG. 8. It may be seen that the logical data signal on the RDB and RDB* leads is retarded for one clock cycle relative to the case of a CAS latency of 1.

In summary, considering the entire circuit, for latency of one the output buffer 11 is enabled and the data from amplifier 3 can pass directly to the output lead 13 (41). For the case of latency of two and three the output buffer 11 is not enabled, and data is stored in the latches 43 and 57 in the RDB_CTRL circuit.

For a latency of two, on the second clock cycle, the output buffer 11 is enabled, and data from the previous clock cycle is sent to the output lead 13 (21), and the RDB and RDB* leads are precharged. This is the signal for the control 5 that new data can be brought to latches 43 and 57, to wait there for the next clock cycle.

For a latency of three, the output buffer 11 is not enabled, and data from the second clock cycle is stored in the above-described latches in read amplifier 3. The portions of the RDB and RDB, lines that remain split (not precharged) extend that way for the interval of the enable signal of the read amplifiers. The data from the second clock cycle will be retained in the latches of the read amplifier for as long as the enable signal is true.

On the third clock cycle the output buffer 11 is enabled, allowing the data from the first clock cycle to pass to the output lead 13 (41). The RDB and RDB* leads now are precharged, signalling that the data from the second clock cycle can be transferred from the read amplifier to the RDB_CTRL circuit. In this manner the data from the third clock cycle can be placed in the read amplifiers and be retained there until it is moved to the RDB_CTRL circuit on the next clock cycle.

The cycle described above repeats itself on each clock cycle.

A person skilled in the art understanding the description above may now design alternative embodiments and variations using the principles described herein. All those falling within the scope of the claims appended hereto are considered to be part of the present invention.

We claim:

1. A variable latency output circuit for a synchronous dynamic random access memory (SDRAM) comprising:
    (a) means for reading a pair of complementary data bus lines,
    (b) means for receiving an output signal of the reading means, and for providing an output signal to an output driver,
    (c) an output buffer for receiving the output signal of the receiving means,
    (d) a latency counter for receiving and counting a clock signal and for the output buffer for outputting the output signal and for providing an output enable signal upon counting a predetermined number of clock pulses based on a predetermined latency, and
    (e) means for enabling the reading means, the receiving means and the output buffer to pass data logic levels from the data bus lines to the output driver within one clock cycle in the event of a latency of one, for delaying said data logic levels for one clock cycle in the event of a latency of two, and for delaying said data logic levels for two clock cycles in the event of a latency of three.

2. A circuit as defined in claim 1 in which the receiving means is comprised of first latch means, means for enabling storage of the data logic levels in the latch means for one clock cycle in the event of a latency of two before providing the stored data logic levels to the output buffer.

3. A circuit as defined in claim 2 in which the reading means is comprised of second latch means, means for enabling storage of the data logic levels in the second latch means for one clock cycle before providing the stored data logic levels to the first latch means, and means for storage of the data logic levels provided to the first latch means for one clock cycle before providing the data logic levels stored in the first latch means to the output buffer, in the event of a latency of three.

4. A circuit as defined in claim 2 in which the first latch means is comprised of a pair of cross-coupled inverters connected in series with each one of a pair of data logic level conductors between the reading means and the output buffer.

5. A circuit as defined in claim 3 in which the second latch means is comprised of a sense amplifier.

6. A circuit as defined in claim 5 in which the first latch means is comprised of a pair of cross-coupled inverters connected in series with each one of a pair of data logic level conductors between the reading means and the output buffer.

* * * * *